United States Patent [19]
Hantke

[11] Patent Number: 5,254,995
[45] Date of Patent: Oct. 19, 1993

[54] ANALOG TO DIGITAL PEAK DETECTOR UTILIZING A SYNCHRONIZATION SIGNAL

[75] Inventor: Horst Hantke, Berlin, Fed. Rep. of Germany

[73] Assignee: Siemens Nixdorf Informationssysteme AG, Fed. Rep. of Germany

[63] Continuation at PCT/EP91/00242, Feb. 8, 1991.

[30] Foreign Application Priority Data

Feb. 16, 1990 [DE] Fed. Rep. of Germany ....... 4005037

[51] Int. Cl.⁵ ............................................. H03M 1/36
[52] U.S. Cl. .................................... 341/159; 341/132
[58] Field of Search ............... 341/159, 132, 158, 160, 341/155; 360/48, 51, 70; 375/113, 116

[56] References Cited

U.S. PATENT DOCUMENTS

| | | | |
|---|---|---|---|
| 3,221,324 | 11/1965 | Margopoulos | 341/132 |
| 3,858,199 | 12/1974 | Neuner et al. | 341/132 |
| 4,611,194 | 9/1986 | Konig et al. | 341/122 |
| 4,937,689 | 6/1990 | Seaver et al. | 360/78.07 |

FOREIGN PATENT DOCUMENTS

| | | |
|---|---|---|
| 0208437 | 1/1987 | European Pat. Off. |
| WO88/03726 | 5/1988 | PCT Int'l Appl. |
| WO88/03728 | 5/1988 | PCT Int'l Appl. |

OTHER PUBLICATIONS

IEEE 1980 IECI Proceedings, Philadelphia, Pa., US, Mar. 17-20, 1980, "Application of Mini and Microcomputers", R. Lumia.
Electronic Engineering, Sep. 1970 "Applications", ITT Semiconductors, pp. 96-99.
IBM Technical Disclosure Bulletin, 31 (1988) Nov., No. 6, "Position Error Signal Read Logic", pp. 95 & 96.
"Halbleiter-Schaltungstechnik", U. Tietze Ch. Schenk, pp. 761-765, #24.8 Ausfuhrung von AD-Umsetzern.

Primary Examiner—A. D. Pellinen
Assistant Examiner—Brian K. Young
Attorney, Agent, or Firm—Hill, Steadman & Simpson

[57] ABSTRACT

A method for converting an analog voltage (U) into a digital value, includes the voltage (U) being compared with a plurality of mutually different reference voltages (Ur1 to Urn). Depending on the respective comparison, a binary value is produced, which is stored each in one bistable memory element (F1 to Fn) controlled by an enabling signal (22). Thereafter, the stored binary values are converted into the digital value and the latter is emitted. The enabling signal (22) sets all the memory elements (F1 to Fn) to an initial state at the start of the conversion. It is possible to convert a peak value of an analog voltage (U) into a digital value rapidly and precisely, and the voltage (U) may also have an aperiodic profile.

10 Claims, 3 Drawing Sheets

ANALOG TO DIGITAL PEAK DETECTOR UTILIZING A SYNCHRONIZATION SIGNAL

This is a continuation of application Ser. No. PCT/EP91/00242, filed 8 Feb. 1991.

BACKGROUND OF THE INVENTION

Field of the Invention

The invention relates to a method for converting an analog voltage into a digital value, especially for converting a servo signal of a disk memory system into a digital value. The invention also relates to a circuit arrangement for carrying out the above-mentioned method.

Description of the Related Art

The publications Electronic Engineering, September 1970, "Application", pages 96 to 97 and IEEE 1980 IECI Proceedings, Philadelphia, Pa., US, 17th to 20th March, 1980, "Applications of Mini and Micro Computers", R. Lumia: "Low Cost Optical Data Acquisition System", pages 299 to 301 disclose a method for converting an analog voltage into a digital value. The known method uses bistable or tristable memory elements in order to detect the maximum values of analog signals within a predetermined time interval. These maximum values are stored digitally in the memory elements. The memory elements are set to a predetermined, defined state at the start of an analog/digital conversion, by means of a signal.

PCT Published Application WO-A-88/03728 also discloses a method for converting an analog voltage into a digital value. In the disclosed method, a logic circuit is provided by means of which the time of a change in the analog voltage can be detected. Delay components, which are connected to the outputs of comparator elements, are used for this purpose. A change in the analog voltage within the delay time of the delay components produces a clock signal. The clock signal controls a memory circuit which stores the present digital value that corresponds to the applied analog voltage. The time of occurrence of a peak value in the analog voltage cannot be identified using this known method or using this known circuit arrangement.

A conversion method is described in Halbleiter-Schaltungstechnik, U. Tietze Ch. Schenk, 8th Edition, 1986, pages 761 to 765. In this method, which is also known as the parallel method, the voltage to be converted is compared simultaneously, in comparator elements, with a large number of reference voltages, and a determination is made as between which two reference voltages the voltage lies. The digital value assigned to these reference voltages is emitted as the binary conversion result. In this way, the digital value is obtained in a single step. As a consequence, the conversion time is very short in comparison with other analog-digital conversion methods, so that even voltage values which change rapidly can be converted.

In the known method, the binary values determined by the comparison in the comparator elements are stored in buffers of edge-triggered D flip-flops. On the rising edge of an enabling signal, these D flip-flops assume the binary values which are present at the outputs of the comparator elements after the comparison and store these values until the next rising edge of the enabling signal. This ensures that a subsequent code converter, which finally produces the digital value from the stored binary values, receives constant input signals for one clock cycle of the enabling signal, which is a precondition for determining correct numerical values.

In numerous applications it is necessary to detect an extreme or peak value, that is to say the maximum value or minimum value, in a voltage which is changing rapidly and aperiodically, and to emit the peak value as the digital value. For example, when processing servo signals in disk-storage systems, it is necessary to determine the peak values of four track signals which define the track center position of a servo head using the known quadrature dibit method. If these peak values are not detected precisely, the occurrence of track deviations, which cannot be corrected without further measures, is unavoidable.

In the known method, if a peak value occurs in the time between two rising edges of the enabling signal, this value cannot be emitted as a digital value since the buffer elements store the binary values which are present at the outputs of the comparator elements at the instant of the rising edge of the enabling signal, rather than the binary values representing the peak values. If one wished to convert only the peak value of the voltage into a digital value using the known method, it would be necessary first to determine precisely the time of the peak value in order to be able to start the conversion at the correct time. This would necessitate expenditure of a considerable cost for analog electronics and would also adversely affect the accuracy with which the peak value could be detected, because the capacitors required for this purpose would necessarily change the voltage profile, even if their capacitances were small.

SUMMARY OF THE INVENTION

The object of the invention is to provide a method and a circuit arrangement by means of which the occurrence of an extreme or peak value in the analog voltage is determined and the time of the peak can be detected.

This object is achieved by a method including comparing the analog voltage with a plurality of mutually different reference voltages to produce binary values depending on results of the comparing step, setting bistable memory elements to an initial state at a start of a conversion by an enabling signal, storing the binary values in the bistable memory elements, converting the binary values stored in the bistable memory elements into a digital value, emitting the digital value, and forming a synchronization signal by performing a first logical function on the binary values and an inversion of the binary values to form logical intermediate values and performing a second logical function on all logical intermediate values to form the synchronization signal which indicates a time of occurrence of the peak value. The invention also relates to a circuit arrangement having a plurality of comparator elements to which an analog voltage to be converted is supplied, and which have mutually different reference voltages, with which the analog voltage is compared, and which each produce a binary value as a function of the respective comparison, means for generating an enabling signal, bistable memory elements each having a set input connected to an output of the comparator elements and a reset input which can be controlled by the enabling signal so that the enabling signal is capable of resetting the bistable memory elements to an initial state at a start of conversion, a code converter connected to receive output signals from the bistable memory elements and which converts the output signals into a digital value and emits the digital value, OR-gates connected to the output of each of the comparator elements, one input of the OR-gate being connected to the output of a respective one of the comparator element, another input of the OR-gate being connected to an inverting output of the bistable memory element which is connected to the output of the respective comparator element, and a NAND-gate having inputs each connected to an output of ones of the OR-gates and which emits a synchronization signal at an output of the NAND-gate.

The invention is based on the knowledge that a peak or extreme value of a voltage occurring in a time period is always followed by voltage values which are less than the peak value for a maximum value or higher than the peak value for a minimum value. This even applies to pulses which have very steep edges. During the comparison of the voltage with the reference voltages, the instantaneous values of the voltage are represented in the form of binary values. As a result of the memory elements being set to a defined initial state, that is to say to the binary values 0 or 1, whose significance is explained in even more detail later, they are activated in such a manner that, although they can change into the other binary state, they no longer revert from this state to the initial state, however, until the next enabling signal occurs.

The change of a binary state of a memory element, thus, means that the voltage has exceeded (for maximum detection) or fallen below (for minimum detection) the reference voltage allocated to the memory elements at least once. The memory elements can thus be split into a contiguous group having the binary value of the initial state and a group having the other binary value. The peak value of the voltage now lies between the reference voltages of the two adjacent memory elements having a mutually different binary value, and is represented by the binary value pattern of the memory elements. The stored binary values are then converted into the digital value.

Using the method according to the invention, peak maximum values or minimum values can be detected and converted. As an example, it is assumed that, during the comparison of the voltage with the reference voltages, in each case one binary value 1 is produced when the voltage is greater than the respective reference voltage. If the enabling signal now sets the memory elements to the initial state 0 at the start of the conversion, those memory elements change to the binary state 1 for which a larger voltage than the respective reference voltage has been confirmed during the comparison. All the other memory elements remain in their initial state, with the binary value 0. Subsequent conversion of the stored binary values into a numerical value, for example by a priority decoder or another code converter, produces a digital value which specifies the peak value of the voltage. The logic levels used in the example are referred to as positive logic in the following text. It is, of course, also possible to implement the invention using logic levels that are the inverse of this, without deviating from the idea of the invention.

If, using the method according to the invention, it is intended to detect a peak value and to emit the value as a digital value, in the case of the above-mentioned example using positive logic it is necessary only to set the initial state of all the memory elements to the binary value 1 at the start of the conversion. Once the time period in which it is intended to confirm the minimum value has elapsed, the conversion result is available on the memory elements as an inverse binary pattern. During the subsequent conversion into the digital value, the inversion can be omitted, for example by inverting the binary values or by forming the inverse digital value.

The voltage to be converted may have an aperiodic profile with a plurality of secondary maxima or secondary minima without the conversion result being adversely affected. Since, in addition, there is no need to use storage components such as capacitors to form the peak value, a high conversion rate and high resolution can be achieved using the present method.

In one preferred embodiment of the invention, it is provided that the binary value is stored in the respective memory elements as a function of a window signal. This measure allows the time period in which the peak value is detected and converted to be constrained to a period known as a time window which occurs within the time between two successive enabling signals. In this way it is possible to effectively filter out interfering voltage values which may occur outside this time window.

In a further advantageous version of the invention, the binary values produced in the respective comparison and the inverted stored binary value are logically linked to one another. Thereafter, the results of the links for all the comparisons are logically linked to form a synchronization signal.

Using this measure, the time of occurrence of the peak value can be established on the basis of the synchronization signal. This should be explained in more detail using the occurrence of a peak value within an enabling signal clock interval. As long as the value of the voltage is rising, one memory element after the other is set to the binary value 1 as a result of the comparison of the voltage with the reference voltages, when using positive logic. The binary value produced in the respective comparison likewise has the value 1. If the voltage drops after reaching the peak value, that binary value which has the next occurring reference voltage to the peak value assumes the value 0 at the input to the memory element, since this reference voltage is the first reference level below which the voltage falls. The case that the inverted output of the memory element has the value 0 and the comparator output has at the same time the value 0 is detected by an OR-gate functioning as a logical conjunction to form an intermediate value. All outputs of the OR-gate are combined in an logical conjunctive element thus, establishing a logical inclusion and detecting that at least one of the latter conditions hold and thus creating a synchronization signal. The above-mentioned logic links identify the voltage drop after the peak value and signals its presence by the synchronization signal. An analogous method is used when it is intended to identify a minimum value as the extreme or peak value.

By means of this version of the invention, it becomes possible to synchronize further processes, such as processing and control processes, to the occurrence of a peak value using the synchronization signal.

Another development of the invention is distinguished in that each stored binary value is AND-linked to the stored binary value having the next-lower reference voltage and to the inverted stored binary value having the next-higher reference voltage, and the result is used for the conversion into the digital value, the stored binary value having the lowest reference voltage being AND-linked only to the inverted stored binary value having the next-higher reference voltage, and the stored binary value having the highest reference voltage being AND-linked only to the stored binary value having the next-lower reference voltage.

As a consequence of inaccuracies in the reference voltages, caused, for example, by temperature drift in the electronic components required to carry out the method and as a consequence of different propagation times of the signals in the components, when determining the peak values of the voltage, it can arise that a memory element having a higher reference voltage has already switched into the binary state that differs from the initial state before this state appears at the output of the memory element having the next-lower reference voltage. The consequence of this is that the bit pattern at the outputs of all the memory elements reproduces an incorrect numerical value.

The above-mentioned measures produce a so-called 1-of-n signal. This means that, of n binary values which are produced during the comparison of the voltage with the reference voltages, only those are emitted as the result having the value 1 whose reference voltage has just been exceeded by the voltage. All the other links have the value 0. This type of linking avoids the production of incorrect numerical values, and the linkage result can be used as a reliable output value for the subsequent conversion into the digital value.

In a further configuration of the invention, a circuit arrangement for carrying out the method is distinguished in that the analog voltage is supplied to a plurality of comparator elements which have mutually different reference voltages with which the analog voltage is compared, and which each produce a binary value, as a function of the respective comparison, which is supplied in each case to the set input of a bistable memory element, which can be controlled by an enabling signal at the reset input, and in that the output signals of all the memory elements are supplied to a code converter which converts them into a digital value and emits the digital value. RS flip-flops may be used as the memory elements. Both the comparator elements and the memory elements have high signal processing rates. As a consequence, very short conversion times can be achieved and the peak values of the voltage can be determined very precisely.

In one advantageous embodiment of the invention, a NAND-gate is provided in each case between the comparator elements and the memory elements, one input of which NAND-gate is connected to the output of the respective comparator element, the window signal being supplied to its other input. The time window in which it is intended to detect the peak value of the voltage is implemented by means of this link.

BRIEF DESCRIPTION OF THE DRAWINGS

Exemplary embodiments of the invention are explained in the following text using the drawing, in which.

DETAILED DESCRIPTION OF THE PREFERRED EMBODIMENTS

Figure 1:
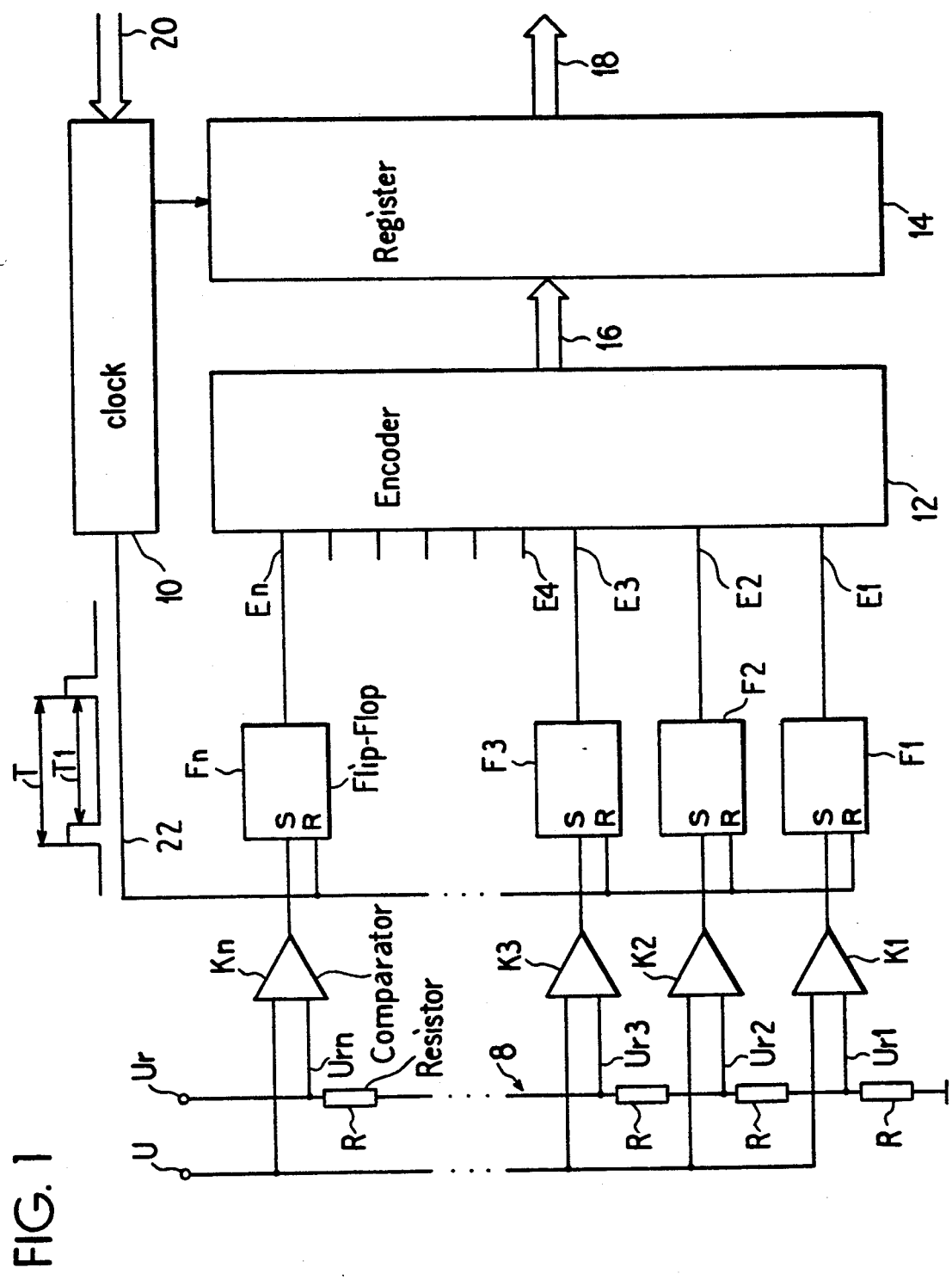
FIG. 1 shows a circuit arrangement for converting a peak value of an input voltage into a digital value.

FIG. 1 shows a circuit arrangement by means of which the method according to the invention for converting a peak value of an analog voltage into a digital value can be implemented. One comparator element is required for each possible digital value. In the present example, these digital values are specified by an eight-digit binary number. This means that 255 comparator elements K1 to Kn, where n = 255, are required. No separate comparator element is required for the digital value 0, so that in practice one element less than the range values of the digital value is required.

The comparator elements K1 to Kn are in each case connected to their reference voltage input by means of a voltage tap of a reference voltage divider 8 which is formed from a series circuit of n resistors R. The reference voltages Ur1, Ur2, Ur3 to Urn are produced thereon from a master reference voltage. The voltage U to be converted is in each case supplied to the other input of the comparator elements K1 to Kn.

The voltage U and the respective reference voltage Ur1 to Urn are compared with one another in each comparator K1 to Kn. If the voltage U is less than the reference voltage Ur1 to Urn, the relevant comparator element K1 to Kn thus produces a voltage at its output which corresponds to the binary value 0. If the voltage U is equal to or greater than the reference voltage Ur1 to Urn, it thus produces a voltage which corresponds to the binary value 1.

Each output of the comparator elements K1 to Kn is connected to the set input S of an RS flip-flop F1 to Fn. The reset inputs R of the RS flip-flop F1 to Fn are interconnected. They are supplied with the enabling signal 22, which is produced in a clock element 10 and is used for resetting the RS flip-flops F1 to Fn. The clock element 10 is supplied via a bus 20 with signals which are provided by a higher-level controller that is not shown.

The outputs of the RS flip-flops F1 to Fn are connected to an input E1 to En of an encoder element 12, respectively. The latter is, for example, a priority decoder which produces a dual code from a 1-of-n code. After the conversion of the input signals at the inputs E1 to En, there is a digital value at its 8-bit output which corresponds to the highest input number of its inputs E1 to En at which the binary value 1 is present. The value of the output signals of the RS flip-flops F1 to Fn below this is not used.

The digital value present at the output of the encoder element 12 is passed on via an 8-bit bus 16 to a register 14 where it is buffer-stored. The digital value is emitted to a data bus 18, controlled by signals from the clock element 10, and is, for example, further-processed by the higher-level controller.

The method of operation of the circuit arrangement according to FIG. 1 is explained in the following text. At the start of the conversion, all the flip-flops F1 to Fn are set to the initial state with the binary value 0 by means of the enabling signal 22 which acts on the reset inputs of the RS flip-flops F1 to Fn. Only binary values of 0 are thus offered to the inputs E1 to En of the encoder element 12, so that its output indicates the digital value 0. Those elements K1 to Kn whose reference voltages Ur1 to Urn are exceeded by the voltage U switch their outputs to the binary value 1, depending on the magnitude of the voltage U at the inputs of the comparator elements K1 to Kn.

Since the outputs of these comparator elements K1 to Kn act directly on the set inputs of the RS flip-flops F1 to Fn, the latter change into the binary state 1 and remain therein, even if the binary value of the relevant comparator elements K1 to Kn changes back to 0. The binary pattern which is reproduced at the outputs of the flip-flops F1 to Fn and consists of a group having the value 1 and a group having the value 0 thus represents the maximum voltage value occurring since the flip-flops F1 to Fn were reset. The encoder element 12 converts this binary pattern into the digital value having a width of 8 bits. Once the time T has elapsed, there is a digital value at the output of the encoder element 12 which indicates the peak value of the voltage within the time interval T1, which extends from the time of the falling pulse edge of the enabling signal to the time of the rising edge of the next pulse. Thereafter, the digital value is emitted via the data bus 18 and a new conversion is started by the enabling signal 22.

Figure 2:
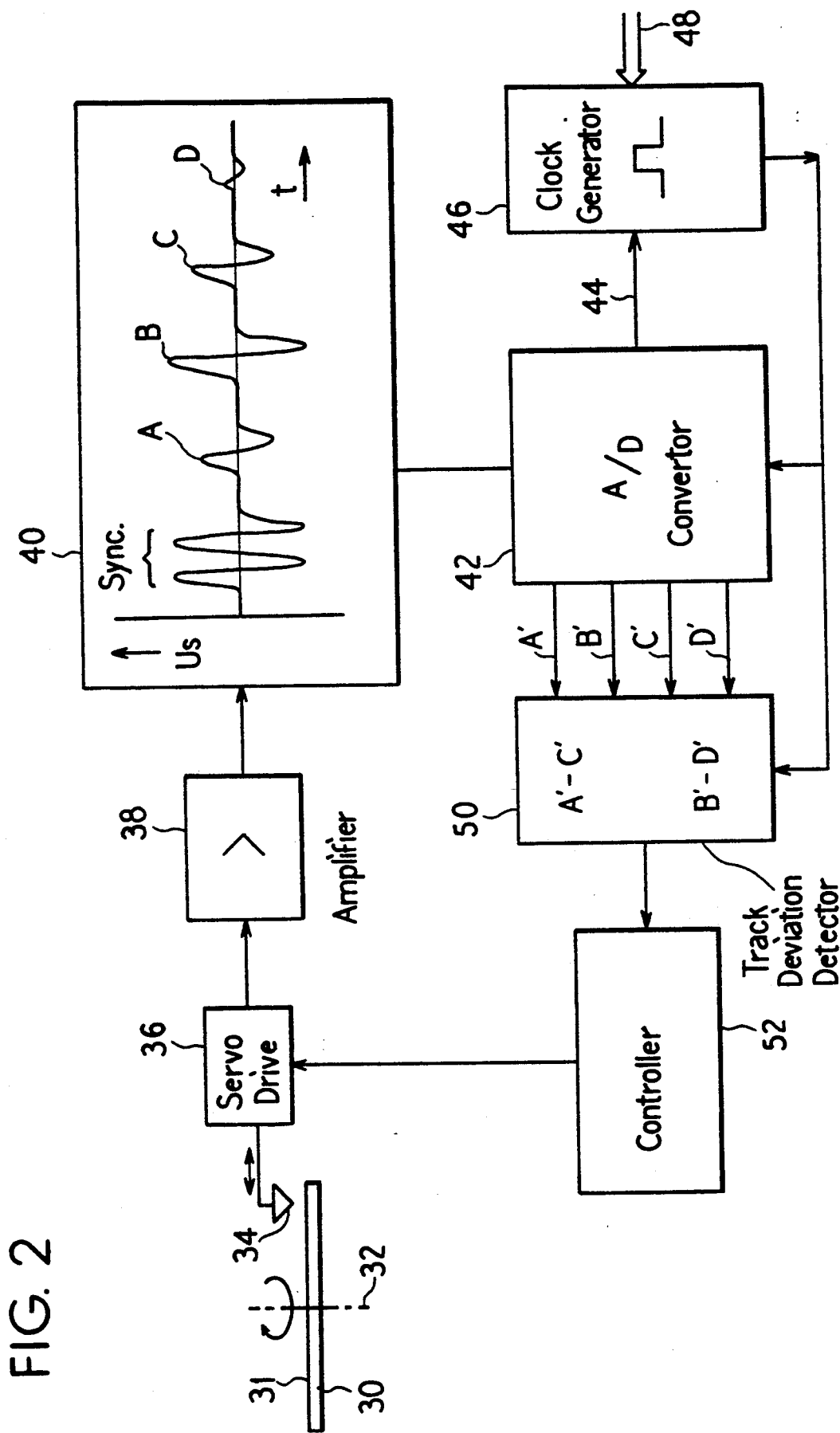
FIG. 2 shows an arrangement for use of the invention for track control of a disk storage system, in a block diagram representation.

FIG. 2 shows a use of the invention for track control of a magnetic disk storage system, in a block diagram. A magnetic disk 30 having a servo surface 31 rotates about a rotation axis 32. A servo head 34 scans the position information, which is stored in circular form on the servo surface 31. The position of the servo head 34 can be varied radially with respect to the servo surface 31 by a servo drive 36.

The servo signals produced by the servo head 34 are amplified in an amplifier 38. A graphical representation of the servo signals is reproduced in the block 40, over the time t, in the form of a servo voltage Us. The known quadrature dibit method is used for track position control of the servo head 34. In this method, positioning marks which are offset with respect to one another such that they define center lines of magnetic tracks are stored on the servo surface 31 in the form of double flux changes. When the positioning marks are scanned by the servo head 34, voltages pulses are produced which are designated by Sync, A, B, C, D in the block 40 and are distributed in accordance with a defined time pattern. The pulses which are designated by Sync in the block 40 are used for synchronization of the successive four pulses A, B, C and D, which contain the radial track position information.

When the Sync, A, B, C, and D pulses are evaluated using the quadrature dibit method, the peak values of these voltage pulses are to be determined.

These peak values are obtained using the method according to the invention. The servo voltage Us is supplied to an A/D converter 42, whose construction is further explained later in the description of FIG. 3. The converter 42 produces a synchronization signal 44 which is supplied to a clock generator 46. The latter is supplied with signals from a controller which is not shown, via the control bus 48 and controls the start of the conversion in the converter 42 and the emission of signals from a track deviation detector 50.

After the conversion, there are four digital values A', B', C' and D' at the output of the A/D converter 42 which correspond to the peak voltage values of the pulses A, B, C, D. The track deviation detector 50, which operates digitally, calculates the differences of the digital values A'-C' and B'-D'. If these differ from zero, there is a track deviation, and a controller 52 acts on the servo drive 36 such that the track deviation is controlled to zero. As a result of the rapid peak value determination in the converter 42, it is possible to implement a part of the control loop for track control in a magnet disk storage system digitally. This allows high control accuracy and a simpler circuit concept to be achieved.

Figure 3:
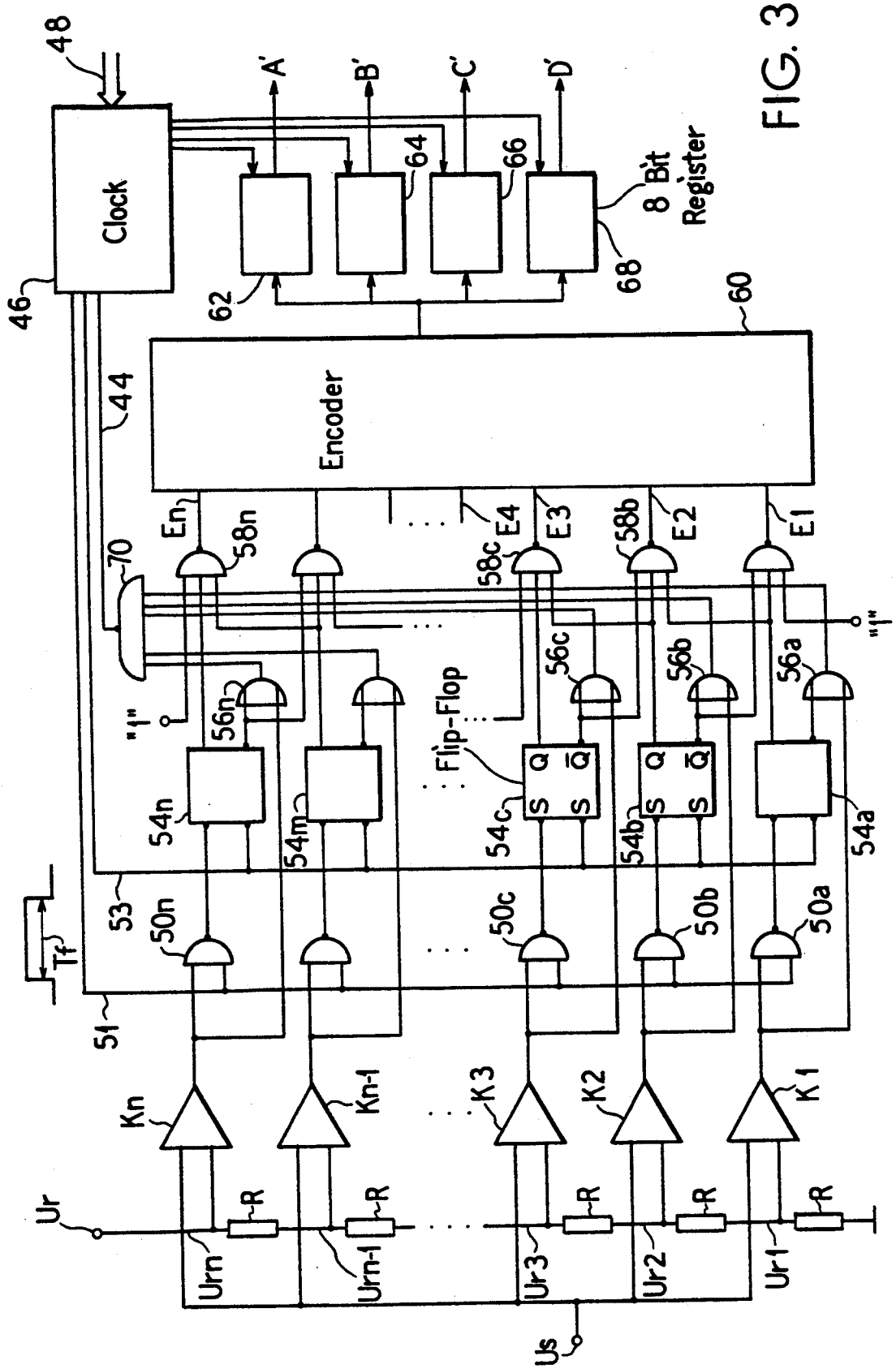
FIG. 3 shows a further circuit arrangement for conversion of peak values into digital values, having various secondary functions.

FIG. 3 shows the A/D converter 42 according to FIG. 2 in more detail. On the input side, its construction corresponds to that shown in FIG. 1, so that this part need not be described again. However, the converter 42 contains important secondary functions which are explained in more detail in the following text. Each comparator element K1 to Kn is connected at its output to the one input of a NAND gate 50a to 50n, to whose other input a window signal 51 is applied, which is produced by the clock generator 46. The outputs of the NAND-gates 50a to 50n are connected to the set input of a RS flip-flop 54a to 54n, while the reset inputs R of the flip-flops 54a to 54n are supplied with an enabling signal 53.

Each RS flip-flop 54a to 54n is connected at its non-inverting output Q to an input of a NAND gate 58a to 58n, which has three inputs. A further input of the NAND gate 58a to 58n is connected to the inverting output of the flip-flops 54b to 54n, which is driven with the next-higher reference voltage Ur1 to Urn via the comparator element K1 to Kn. The third input of the NAND-gate 58a to 58n is connected to the non-inverting output of the flip-flop 54a to 54n, which is driven with the next-lower reference voltage Ur1 to Urn, via the comparator element K1 to Kn. The inputs of the NAND gates 58a to 58n which cannot be assigned in accordance with the above-mentioned linkage rule are set to a voltage value which corresponds to the binary value 1.

The outputs of all the NAND gates 58a to 58n are in each case connected to one input E1 to En of an encoder element 60, which is a priority decoder. The 8-bit output of the encoder element 60 is connected to the inputs of four 8-bit registers 62 to 68, which are supplied by the clock generator 46 with clock pulses. The digital values A', B', C' and D', which correspond to the peak values of the pulses A, B, C, D of the servo voltage Us in FIG. 2, can be tapped off at the outputs of the registers 62 to 68.

The inverting outputs of the RS flip-flops 54a to 54n are also connected in each case to one input of an OR-gate 56a to 56n. The further input of the latter is connected to the output of the comparator element K1 to Kn which controls the flip-flop 54a to 54n. The outputs of the OR-gates 56a to 56n are in each case connected to one input of a NAND gate 70, at whose output the synchronization signal 44 is produced, which is supplied to the clock generator 46.

The method of operation of the circuit arrangement according to FIG. 3 is explained in the following text. A conversion process is started by the emission of the enabling signal 53, all the RS flip-flops 54a to 54n being set to the initial state, in which the non-inverting outputs have the binary value zero. Since the comparator elements K1 to Kn operate continuously, there are binary values at their outputs which, in their totality, represent the instantaneous value of the servo voltage Us as a continuous binary pattern. As a result of the emission of the window signal 51 having the value 1, the outputs of the comparator elements K1 to Kn act, via the NAND gates 50a to 50n, in each case directly on the set input of the flip-flop 54a to 54n connected to their output, and the binary pattern is taken over into the RS flip-flops 54a to 54n, where it is stored. The time Tf, in which the window signal 52 has the value 1, defines the time window in which the peak value of the voltage Us is determined.

The OR-gates 56a to 56n and the NAND-gate 70 are used for producing the synchronization signal 44, by means of which the time of the occurrence of the fixed value can be confirmed. When the voltage Us rises to its maximum value, those outputs of the comparator elements K1 to Kn whose reference voltages Ur1 to Urn exceed the voltage Us, are set to the binary value 1. The outputs remain in this state until the voltage Us falls again. That comparator element, for example K2, whose reference voltage Ur2 has just been exceeded by the peak value of the voltage Us will be the first to emit the binary value 0 at its output. Both inputs of the OR gate 56c then have the binary value 0 and, accordingly, its output also has the binary value 0. In consequence, the synchronization signal 44 having the binary value 1 is produced at the output of the NAND-gate 70. The synchronization signal 44 is processed by the clock generator 46 in order to determine the time position of the Sync, A, B, C, D pulses of the servo voltage Us.

Because of the different processing rates of the comparator elements K1 to Kn, and as a result of the signal propagation times, it is possible to set the non-inverting output of a flip-flop 54a to 54n, although the flip-flop 54a to 54n has not yet been switched through by the next-lower reference voltage value Ur1 to Urn. In consequence, an incorrect conversion result can be produced. This is prevented by the NAND-gates 58a to 58n. For example, the NAND-gate 58b does not switch its output to the binary value 0 until the non-inverting output of the flip-flop 54a having the next-lower reference voltage Ur1 is at the binary value 1 and the inverting output of the flip-flop 54c having the next-higher reference voltage Ur3 is at the binary value 0. This logical interlocking ensures that no incorrect binary values can occur in the binary pattern at the inputs E1 to En of the encoder element 60, and thus also that the code conversion always leads to the correct digital value which corresponds to the peak value of the voltage Us.

The Sync, A, B, C and D pulses have a fixed time relationship to one another, as has already been mentioned. The clock generator 46 controls the emission of the signals 53, 51 and of the set signals for the registers 62 to 68 in accordance with the predetermined time pattern. This type of control is known for the quadrature dibit method and need not be explained in more detail here. Once a plurality of A/D conversions have been carried out, the peak values A', B', C' and D' are available at the outputs of the registers 62 to 68 for further processing in the control loop 52, for track positioning in accordance with FIG. 2.

Although other modifications and changes may be suggested by those skilled in the art, it is the intention of the inventor to embody within the patent warranted hereon all changes and modifications as reasonably and properly come within the scope of his contribution to the art.

I claim:

1. A method for converting a peak value of an analog voltage into a digital value, comprising the steps of:
   comparing the analog voltage with a plurality of mutually different reference voltages to produce binary values depending on results of the comparing step,
   setting bistable memory elements to an initial state at a start of a conversion by an enabling signal,
   storing the binary values in the bistable memory elements if the analog voltage crosses respective ones of the references voltages in a first direction,
   converting the binary values stored in the bistable memory elements into a digital value,
   emitting the digital value, and
   forming a synchronization signal by:
      performing a first logical function on the binary values resulting from said comparing step and an inversion of the binary values stored in the bistable memory elements to form a logical intermediate value when said analog voltage crosses respective ones of said plurality of mutually different reference voltages in a direction opposite said first direction, and
      performing a second logical function on all logical intermediate values to form the synchronization signal if any logical intermediate values are formed so as to indicate an occurrence of the peak value and that the peak value is present as a digital value.

2. The method as claimed in claim 1, wherein said step of storing the binary value in the memory element is dependent on a window signal.

3. The method as claimed in claim 1, wherein said step of converting includes forming a logical conjunction of each stored binary value to the stored binary value having a next-lower reference voltage and to the inverted stored binary value having a next-higher reference voltage, and the stored binary value having a lowest reference voltage being logically conjoined only to the inverted stored binary value having a next-higher reference voltage, and the stored binary value having a highest reference voltage being logically conjoined only to the stored binary value having a next-lower reference voltage for conversion of the binary value into the digital value.

4. The method as claimed in claim 1, wherein the analog voltage to be converted into the digital voltage is produced from servo signals from a disk storage system in order to control track position of a servo head.

5. The method as claimed in claim 4, wherein the servo signals are produced using the quadrature dibit method.

6. A method as claimed in claim 1, wherein said first logical function includes an OR function, and wherein said second logical function includes a NAND function.

7. A circuit arrangement for converting an analog voltage into a digital value, comprising:
   a plurality of comparator elements to which an analog voltage to be converted is supplied, and which have mutually different reference voltages, with which the analog voltage is compared, and which each produce a binary value as a function of the respective comparison,
   means for generating an enabling signal,
   bistable memory elements each having a set input connected at least indirectly to an output of said comparator elements and a reset input which can be controlled by said enabling signal so that said enabling signal is capable of resetting said bistable memory elements to an initial state at a start of conversion,
   a code converter connected at least indirectly to receive output signals from the bistable memory elements and which converts the output signals into a digital value and emits said digital value, OR-gates connected to the output of each of said comparator elements, one input of said OR-gate being connected to the output of a respective one of said comparator element, another input of said OR-gate being connected to an inverting output of said bistable memory element which is connected to the output of the respective comparator element, and a NAND-gate having inputs each connected to an output of ones of the OR-gates and which emits a synchronization signal at an output of said NAND-gate.

8. The circuit arrangement as claimed in claim 7, wherein RS flip-flops are provided as the memory elements.

9. The circuit arrangement as claimed in claim 7, further comprising:

NAND-gates connected each between said comparator elements and said bistable memory elements, one input of said NAND-gate being connected to the output of said respective comparator element, means for generating a window signal being connected to another input of said NAND-gates.

10. The circuit arrangement as claimed in claim 7, further comprising:

NAND-gates having three inputs connected between each of said bistable memory elements and said code converter, first input of said NAND-gates being connected to non-inverting outputs of said respective bistable memory elements, second inputs being connected to non-inverting outputs of said bistable memory elements having next-lower reference voltages and third inputs being connected to inverting outputs of said bistable memory elements having next-higher reference voltages, said third input of said NAND-gate which is connected to said output of said bistable memory element having a highest reference voltage, and said second input of said NAND-gate which is connected to said output of said bistable memory element having a lowest reference voltage being connected each to a voltage level at logic level 1.

* * * * *